(12) United States Patent
Lee et al.

(10) Patent No.: US 11,415,633 B2
(45) Date of Patent: Aug. 16, 2022

(54) CURRENT MEASURING APPARATUS, CURRENT MEASURING METHOD AND BATTERY PACK INCLUDING THE CURRENT MEASURING APPARATUS

(71) Applicant: LG Chem, Ltd., Seoul (KR)

(72) Inventors: Won-Tae Lee, Daejeon (KR); Yang-Lim Choi, Daejeon (KR)

(73) Assignee: LG Energy Solution, Ltd.

(\*) Notice: Subject to any disclaimer, the term of this patent is extended or adjusted under 35 U.S.C. 154(b) by 209 days.

(21) Appl. No.: 16/767,219

(22) PCT Filed: Jun. 11, 2019

(86) PCT No.: PCT/KR2019/007013
§ 371 (c)(1),
(2) Date: May 27, 2020

(87) PCT Pub. No.: WO2019/245215
PCT Pub. Date: Dec. 26, 2019

(65) Prior Publication Data
US 2020/0386823 A1 Dec. 10, 2020

(30) Foreign Application Priority Data

Jun. 22, 2018 (KR) .................. 10-2018-0072156
May 31, 2019 (KR) .................. 10-2019-0064721

(51) Int. Cl.
*G01R 31/3842* (2019.01)
*G01R 31/367* (2019.01)
(Continued)

(52) U.S. Cl.
CPC ....... *G01R 31/3842* (2019.01); *G01R 19/165* (2013.01); *G01R 27/08* (2013.01); *G01R 31/367* (2019.01); *H01M 10/486* (2013.01)

(58) Field of Classification Search
CPC .. G01R 31/3842; G01R 19/165; G01R 27/08; G01R 31/367; G01R 19/0092;
(Continued)

(56) References Cited

U.S. PATENT DOCUMENTS 4,163,934 A * 8/1979 Lawn ................ H02J 7/007184
320/DIG. 22
5,444,378 A * 8/1995 Rogers ............ H02J 7/007194
320/136
(Continued)

FOREIGN PATENT DOCUMENTS

CN 101399441 A 4/2009
CN 104836271 A 8/2015
(Continued)

OTHER PUBLICATIONS

Search Report dated Nov. 16, 2021 from Office Action for Chinese Application No. 201980006148.7 dated Dec. 1, 2021. 3 pgs.
(Continued)

*Primary Examiner* — Tung S Lau
(74) *Attorney, Agent, or Firm* — Lerner, David, Littenberg, Krumholz & Mentlik, LLP

(57) ABSTRACT

A current measuring apparatus including a switching circuit installed on the charging and discharging path, a current measuring unit having a shunt resistor installed on the charging and discharging path and configured to output a current signal corresponding to a voltage across the shunt resistor, a voltage measuring unit configured to measure the voltage across the switching circuit, a temperature measuring unit configured to measure a temperature of the switching circuit, and a control unit. The control unit determines a first current value indicating a current flowing through the shunt resistor, based on the current signal. The control unit determines a second current value indicating a current flowing through the switching circuit, based on the mea-
(Continued)

sured voltage and the measured temperature. The control unit determines whether the shunt resistor is in a normal state, based on the first current value and the second current value.

13 Claims, 4 Drawing Sheets

(51) Int. Cl.
  *G01R 19/165* (2006.01)
  *G01R 27/08* (2006.01)
  *H01M 10/48* (2006.01)

(58) Field of Classification Search
  CPC .. G01R 19/16542; G01R 35/00; G01R 1/203; G01R 31/382; G01R 19/16571; G01R 31/3648; H01M 10/486; H01M 10/48; Y02E 60/10
  See application file for complete search history.

(56) References Cited

U.S. PATENT DOCUMENTS

| | | | |
|---|---|---|---|
| 6,707,273 B1* | 3/2004 | Gignac | H02J 7/045 |
| | | | 320/137 |
| 6,914,416 B2* | 7/2005 | Thomas | H02J 7/0031 |
| | | | 361/720 |
| 10,215,811 B2* | 2/2019 | Hermann | G01R 31/364 |
| 2006/0164042 A1 | 7/2006 | Sim | |
| 2006/0186857 A1* | 8/2006 | Matty | H01M 10/46 |
| | | | 320/122 |
| 2009/0085519 A1 | 4/2009 | Kim | |
| 2009/0132188 A1* | 5/2009 | Watanabe | H01M 10/44 |
| | | | 702/64 |
| 2009/0295334 A1 | 12/2009 | Yang et al. | |
| 2011/0279094 A1 | 11/2011 | Nakatsuji et al. | |
| 2013/0033209 A1 | 2/2013 | Murata et al. | |
| 2015/0229144 A1 | 8/2015 | Jang et al. | |
| 2016/0065067 A1 | 3/2016 | Isham et al. | |
| 2016/0322840 A1 | 11/2016 | Maetani | |
| 2017/0003353 A1 | 1/2017 | Seo | |
| 2017/0021696 A1 | 1/2017 | Nagasaka et al. | |
| 2017/0089955 A1 | 3/2017 | Yugou et al. | |
| 2017/0199244 A1* | 7/2017 | Hermann | G01R 31/364 |
| 2017/0250254 A1 | 8/2017 | Tanioka et al. | |
| 2018/0188326 A1 | 7/2018 | Huh et al. | |
| 2019/0173381 A1 | 6/2019 | Isham et al. | |

FOREIGN PATENT DOCUMENTS

| | | | | |
|---|---|---|---|---|
| CN | 105388350 A | 3/2016 | | |
| CN | 106031300 A | 10/2016 | | |
| CN | 106100008 A | 11/2016 | | |
| CN | 106662603 A | 5/2017 | | |
| CN | 107850643 A | 3/2018 | | |
| EP | 2043224 A2 | 4/2009 | | |
| EP | 2911267 A1 | 8/2015 | | |
| JP | H06130112 A | 5/1994 | | |
| JP | 3061855 | * | 9/1999 | H02J 7/00 |
| JP | 2006208377 A | 8/2006 | | |
| JP | 2009122056 A | 6/2009 | | |
| JP | 2011085470 A | 4/2011 | | |
| JP | 2013034319 A | 2/2013 | | |
| JP | 5691993 B2 | 4/2015 | | |
| JP | 2015154711 A | 8/2015 | | |
| JP | 2016101068 A | 5/2016 | | |
| JP | 2017015432 A | 1/2017 | | |
| KR | 101042768 B1 | 6/2011 | | |
| KR | 101192146 B1 | 10/2012 | | |
| KR | 101264428 B1 | 5/2013 | | |
| KR | 20130137389 A | 12/2013 | | |
| KR | 20140073309 A | 6/2014 | | |
| KR | 20150016851 A | 2/2015 | | |
| KR | 20160066762 A | 6/2016 | | |
| KR | 20160129747 A | 11/2016 | | |
| KR | 20170004499 A | 1/2017 | | |
| WO | 2016071990 A1 | 5/2016 | | |

OTHER PUBLICATIONS

Extended European Search Report including Written Opinion for Application No. 19823590.5 dated Feb. 1, 2021, pp. 1-10.
International Search Report for Application No. PCT/KR2019/007013 dated Sep. 19, 2019, 3 pages.

* cited by examiner

| TEMPERATURE(°C) | ON-RESISTANCE(Ω) |
|---|---|
| ... | ... |
| a | $x$ |
| ... | ... |
| b | $y$ |
| ... | ... |

CURRENT MEASURING APPARATUS, CURRENT MEASURING METHOD AND BATTERY PACK INCLUDING THE CURRENT MEASURING APPARATUS

CROSS-REFERENCE TO RELATED APPLICATIONS

The present application is a national phase entry under 35 U.S.C. § 371 of International Application No. PCT/KR2019/007013 filed Jun. 11, 2019, published in Korean, which claims priority from Korean Patent Application No. 10-2018-0072156 filed Jun. 22, 2018, and Korean Patent Application No. 10-2019-0064721 filed May 31, 2019, all of which are incorporated herein by reference.

TECHNICAL FIELD

The present disclosure relates to an apparatus and method for measuring a current flowing through a charging and discharging path of a battery pack, and a battery pack including the apparatus.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance secondary batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In order to measure the current flowing through a battery, a shunt resistor may be installed on a charging and discharging path for the battery. The current measured using the shunt resistor is essentially utilized for determining the overcurrent or estimating the state of charge (SOC) and the state of health (SOH) of the battery.

Current measurement using the shunt resistor is based on dividing the voltage across both ends of the shunt resistor by a reference resistance. The reference resistance is determined in advance in consideration of the material, size, shape, etc. of the shunt resistor. However, if the shunt resistor gradually degrades over time or is damaged by vibration and shock, the actual resistance of the shunt resistor is greatly different from the reference resistance.

In particular, in relation to ISO 26262, which is the international standard for vehicle safety, it is necessary to determine whether the current measured by a current sensor including the shunt resistor is reliable (or, whether the current sensor is normal) in order to satisfy the highest class D among four grades of the Automotive Safety Integrity Level (ASIL). Conventionally, the current measured by the current sensor and the current measured by another current sensor (e.g., a Hall effect current sensor) are compared with each other, thereby improving reliability of the current measurement result. However, since two current sensors are essential, the cost is high and space utilization is inferior.

SUMMARY

Technical Problem

The present disclosure is designed to solve the problems of the related art, and therefore the present disclosure is directed to providing an apparatus and method for diagnosing whether a shunt resistor installed on a charging and discharging path for a battery is in a normal state without an additional current sensor, and a battery pack including the apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a current measuring apparatus for measuring a current flowing through a charging and discharging path of a battery The current measuring apparatus comprises: a switching circuit installed on the charging and discharging path; a current measuring unit including a shunt resistor installed on the charging and discharging path and configured to output a current signal corresponding to a voltage across the shunt resistor; a voltage measuring unit configured to measure a voltage across the switching circuit; a temperature measuring unit configured to measure a temperature of the switching circuit; and a control unit operably coupled to the switching circuit, the current measuring unit, the voltage measuring unit and the temperature measuring unit. The control unit is configured to determine a first current value indicating a current flowing through the shunt resistor, based on the current signal. The control unit is configured to determine a second current value indicating a current flowing through the switching circuit, based on the measured voltage and the measured temperature. The control unit is configured to determine whether the shunt resistor is in a normal state, based on the first current value and the second current value.

The control unit may be configured to determine an on-resistance of the switching circuit, based on the measured temperature. The second current value is obtained by dividing the measured voltage by the on-resistance.

The current measuring apparatus may further comprise a memory device configured to store a look-up table in which a correspondence between a temperature of the switching circuit and an on-resistance of the switching circuit is recorded. The control unit may be configured to determine an on-resistance, which is recorded in the look-up table as being associated with the measured temperature, as the on-resistance of the switching circuit, by using the measured temperature as an index.

The control unit may be configured to determine a third current value indicating the current flowing through the charging and discharging path, based on the first current value and the second current value.

The control unit may be configured to determine one of the first current value, the second current value and an average of the first current value and the second current value as the third current value, when a difference between the first current value and the second current value is within a normal range.

The control unit may be configured to determine the second current value as the third current value, when a difference between the first current value and the second current value is out of a normal range.

The control unit may be configured to output a fault message, when a difference between the first current value and the second current value is out of a normal range.

The control unit may be configured to determine the normal range, based on the measured temperature. The control unit may be configured to enlarge the normal range as the measured temperature is lowered.

In another aspect of the present disclosure, there is also provided a battery pack, comprising a current measuring apparatus as described in any of the embodiments herein.

In another aspect of the present disclosure, there is also provided a current measuring method for measuring a current flowing through a charging and discharging path of a battery. The method comprises: measuring a voltage across a switching circuit that is installed on the charging and discharging path; measuring a temperature of the switching circuit; determining a first current value indicating a current flowing through a shunt resistor that is installed on the charging and discharging path, based on a voltage across the shunt resistor; determining a second current value indicating a current flowing through the switching circuit, based on the measured voltage and the measured temperature; and determining whether the shunt resistor is in a normal state, based on the first current value and the second current value.

The second current value may be obtained by dividing the measured voltage by an on-resistance associated with the measured temperature.

In the step of determining whether the shunt resistor is in the normal state, the shunt resistor may be determined to be in the normal state when a difference between the first current value and the second current value is within a normal range.

Advantageous Effects

According to at least one of embodiments of the present disclosure, it is possible to diagnose whether a shunt resistor installed on a charging and discharging path for a battery is in a normal state without an additional current sensor.

The effects of the present disclosure are not limited to the effects mentioned above, and other effects not mentioned herein will be clearly understood by those skilled in the art from the claims.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
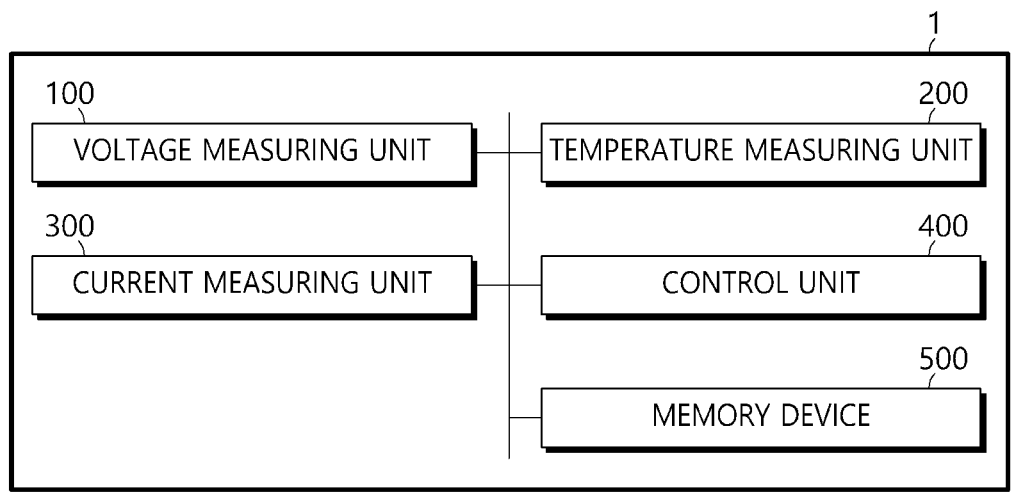
FIG. 1 is a diagram schematically showing a functional configuration of a current measuring apparatus according to an embodiment of the present disclosure.
Figures 2, 3:
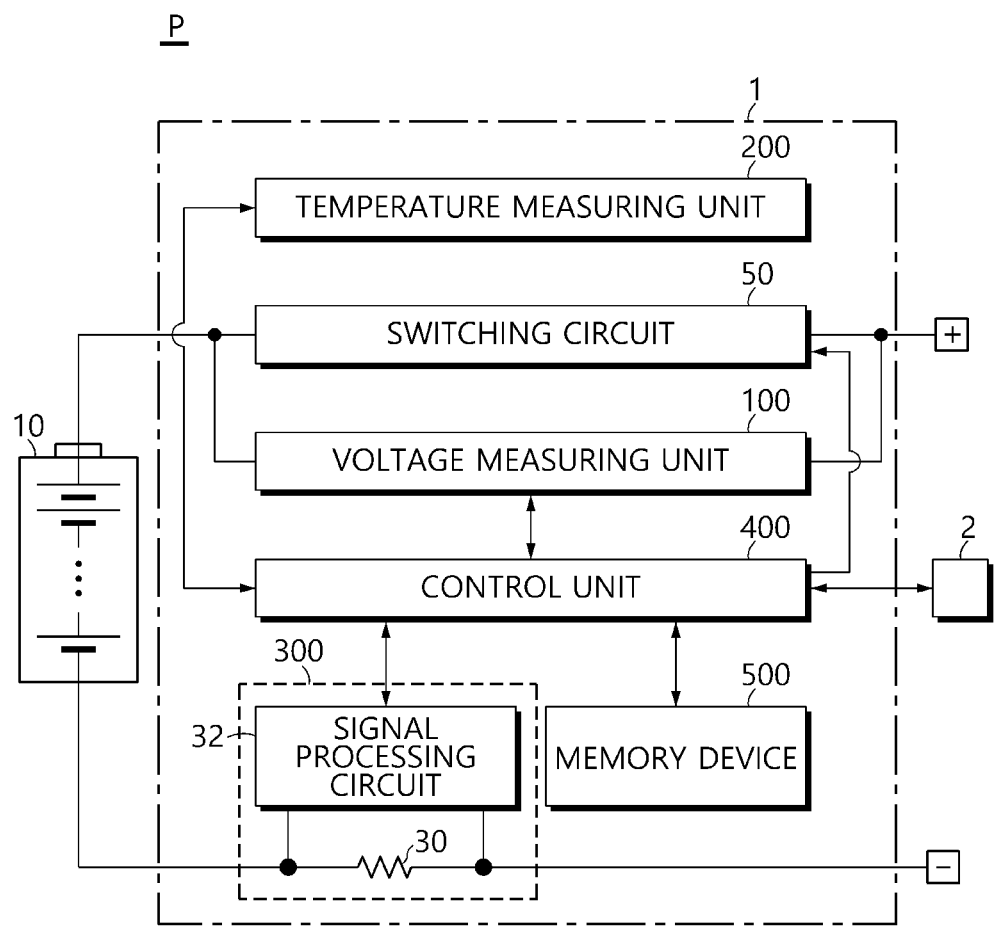
FIG. 2 is a diagram schematically showing a battery pack including the current measuring apparatus of FIG. 1.
FIG. 3 exemplarily shows a first look-up table associated with the switching circuit of FIGS. 1 and 2.

FIG. 1 is a diagram schematically showing a functional configuration of a current measuring apparatus according to an embodiment of the present disclosure, and FIG. 2 is a diagram schematically showing a battery pack including the current measuring apparatus of FIG. 1.

Referring to FIGS. 1 and 2, a battery pack P includes a battery 10, a switching circuit 50 and a current measuring apparatus 1 (hereinafter, referred to as an 'apparatus').

The battery 10 includes at least one battery cell. If a plurality of battery cells are included in the battery 10, the plurality of battery cells may be electrically connected to each other in series or in parallel.

The switching circuit 50 may include at least one charging switch and at least one discharging switch. Each charging switch may be electrically connected in series to each discharging switch. If the switching circuit 50 includes a plurality of charging switches, the plurality of charging switches may be electrically connected in parallel. If the switching circuit 50 includes a plurality of discharging switches, the plurality of discharging switches may be electrically connected in parallel.

Each charging switch may control a current flowing in a direction for charging the battery 10. For example, each charging switch may be located between a positive electrode terminal of the battery 10 and a positive electrode terminal of the battery pack P and adjust the magnitude of the charging current that is a current flowing from the positive electrode terminal of the battery pack P to the positive electrode terminal of the battery 10.

Each discharging switch may control a current flowing in a direction for discharging the battery 10. For example, each discharging switch may be located between the positive electrode terminal of the battery 10 and the positive electrode terminal of the battery pack P and adjust the magnitude of the discharging current which is a current flowing from the positive electrode terminal of the battery 10 to the positive electrode terminal of the battery pack P.

For example, each charging switch and each discharging switch may be a field effect transistor (FET) including gate, drain and source terminals. The FET may be turned on or off depending on the magnitude of the voltage applied between the gate terminal and the source terminal.

The apparatus 1 is provided to measure the current flowing through a charging and discharging path for the battery 10. The apparatus 1 includes a voltage measuring unit 100, a temperature measuring unit 200, a current measuring unit 300, and a control unit 400. The apparatus 1 may further include a memory device 500.

The voltage measuring unit 100 may be electrically connected to both ends of the switching circuit 50. That is, the voltage measuring unit 100 may be electrically connected in parallel to the switching circuit 50 to measure the voltage across the switching circuit 50.

The voltage measuring unit 100 may measure a potential difference between one end and the other end of the switching circuit 50 as the voltage of the switching circuit 50. For example, in the case where one end of each charging switch is electrically connected to the positive electrode terminal of the battery 10, one end of each discharging switch is electrically connected to the positive electrode terminal of the battery pack P, and the other end of each charging switch and the other end of each discharging switch are electrically connected to each other, the potential difference between one end of each charging switch and one end of each discharging switch may be measured as the voltage of the switching circuit 50 by the voltage measuring unit 100.

The voltage measuring unit 100 may be operably coupled to the control unit 400 to exchange electrical signals with the control unit 400. The voltage measuring unit 100 may measure the voltage of the switching circuit 50 every unit time in response to a voltage measuring command from the control unit 400 and output a voltage signal indicating the measured voltage of the switching circuit 50 to the control unit 400.

The temperature measuring unit 200 is located within a predetermined distance from the switching circuit 50 and is provided to measure the temperature of the switching circuit 50. The temperature measuring unit 200 may be operably coupled to the control unit 400 to exchange electrical signals with the control unit 400. The temperature measuring unit 200 may measure the temperature of the switching circuit 50 every unit time and output a temperature signal indicating the measured temperature of the switching circuit 50 to the control unit 400. A known temperature sensor such as a thermocouple may be utilized as the temperature measuring unit 200.

The current measuring unit 300 includes a shunt resistor 30 and a signal processing circuit 32.

The shunt resistor 30 may be located in the charging and discharging path between a negative electrode terminal of the battery 10 and a negative electrode terminal of the battery pack P. The voltage at both ends of the shunt resistor 30 depends on the direction and magnitude of the current flowing through the charging and discharging path.

The signal processing circuit 32 is operably coupled to the control unit 400 to exchange electrical signals with the control unit 400. The signal processing circuit 32 may measure the current flowing through the shunt resistor 30 per unit time based on the voltage across the shunt resistor 30 in response to a current measuring command from the control unit 400 and output a current signal indicating the direction and magnitude of the measured current to the control unit 400.

Two input terminals of signal processing circuit 32 may be electrically connected to one end and the other end of the shunt resistor 30, respectively. The signal processing circuit 32 may amplify the voltage across the shunt resistor 30 received through the two input terminals of the signal processing circuit 32 and then transmit a digital signal indicating the amplified voltage to the control unit 400 as the current signal. The control unit 400 may determine a first current value indicating the direction and magnitude of the current flowing through the charging and discharging path based on the current signal from the signal processing circuit 32 per unit time according to the Ohm's law.

The control unit 400 may be implemented in terms of hardware using at least one of application specific integrated circuits (ASICs), digital signal processors (DSPs), digital signal processing devices (DSPDs), programmable logic devices (PLDs), field programmable gate arrays (FPGAs), microprocessors and electrical units for performing other functions. The memory device 500 may be included in the control unit 400.

The control unit 400 determines a voltage value indicating the voltage across the switching circuit 50 based on the voltage signal per unit time from the voltage measuring unit 100. The control unit 400 determines a temperature value indicating the temperature of the switching circuit 50 based on the temperature signal per unit time from the temperature measuring unit 200.

The control unit 400 may determine a second current value indicating the direction and magnitude of the current flowing through the switching circuit 50 per unit time based on the voltage value and the temperature value associated with the switching circuit 50.

Since both of the first circuit value and the second current value represent the direction and magnitude of the current flowing through the charging and discharging path for the battery 10, the first circuit value and the second current value are typically identical or different within an acceptable range. Meanwhile, the difference between the first current value and the second current value may be significantly increased if the shunt resistor 30 is damaged or a short circuit failure occurs at the shunt resistor 30, etc.

The control unit 400 may estimate an on-resistance of the switching circuit 50 based on the temperature of the switching circuit 50 per unit time. The on-resistance of the switching circuit 50 refers to a resistance of the switching circuit 50 while the switching circuit 50 is in an on-state and may be a parameter depending on temperature. The control unit 400 may refer to a first look-up table in which the correspondence between a temperature and an on-resistance of the switching circuit 50 is recorded, and estimate an on-resistance recorded in the first look-up table to correspond to the temperature of the switching circuit 50 measured at a specific time point as the on-resistance of the switching circuit 50 at the specific time point. The first look-up table may be stored in advance in the memory device 500.

The control unit 400 may determine a second current value indicating the current flowing through the switching circuit 50 at the specific time point by dividing the voltage at both ends of the switching circuit 50 at the specified time point by the estimated on-resistance, according to Ohm's law.

The control unit 400 may determine a third current value indicating the current flowing through the charging and discharging path, based on the first current value and the second current value. For example, the control unit 400 may determine the first current value as a current value flowing through the charging and discharging path, based on the difference between the first current value and the second current value. As another example, the control unit 400 may determine the average of the first current value and the second current value as a current value flowing through the charging and discharging path, based on the first current value and the second current value. As still another example, the control unit 400 may determine the second current value as a current value flowing through the charging and discharging path, based on a difference between the first current value and the second current value.

The control unit 400 may diagnose whether the shunt resistor 30 is in a normal state, based on the difference between the first current value and the second current value. For example, the control unit 400 may determine that the shunt resistor 30 is in a normal state if the difference between the first current value and the second current value is within a normal range (for example, −10 mA to 10 mA).

The normal range may be predetermined. Alternatively, the normal range may be determined by the control unit 400 based on the temperature of the switching circuit 50. The switching circuit 50 may have characteristics in that the on-resistance of the switching circuit 50 decreases as the temperature of the switching circuit 50 rises, and the on-resistance of the switching circuit 50 increases as the temperature of the switching circuit 50 is lowered. Thus, the control unit 400 may lessen the normal range as the temperature of the switching circuit 50 rises, and the control unit 400 may enlarge the normal range as the temperature of the switching circuit 50 is lowered. A second look-up table that records the correspondence between the temperature and the normal range of the switching circuit 50 may be stored in the memory device 500 in advance. The control unit 400 may obtain the normal range associated with the temperature of the switching circuit 50 from the second look-up table by using the temperature of the switching circuit 50 as an index.

If the difference between the first current value and the second current value exceeds the normal range, the control unit 400 may determine that the shunt resistor 30 is in a fault state. The fault state of the shunt resistor 30 may mean a state in which the difference between the resistance of the shunt resistor 30 and a reference resistance exceeds a certain level due to deterioration or damage of the shunt resistor 30. Data indicating the normal range may be stored in advance in the memory device 500. If it is determined that the shunt resistor 30 is in the fault state, the control unit 400 may transmit a fault message to an external device 2. The external device 2 may be an electronic control unit (ECU) of an electric system (for example, an electric vehicle) to which the battery pack P is mounted.

If the difference between the first current value and the second current value is within the normal range, the control unit 400 may determine any one of the first current value, the second current value, and the average of the first current value and the second current value as the third current value. This is because the difference between the first current value and the second current value is within the normal range, indicating that the first current value is reliable.

When the difference between the first current value and the second current value is out of the normal range, the control unit 400 may determine the second current value as the third current value.

The memory device 500 may be operably coupled to the control unit 400 to exchange electrical signals with the control unit 400. The memory device 500 is not particularly limited as long as it is a storage medium capable of recording and erasing data. For example, the memory device 500 may be a RAM, a ROM, a register, a hard disk, an optical recording medium, or a magnetic recording medium. The memory device 500 may be electrically connected to the control unit 400 via, for example, a data bus so as to be accessible by the control unit 400. The memory device 500 may store and/or update and/or erase and/or transmit a program including various control logics performed by the control unit 400 and/or data generated when the control logics are executed.

FIG. 3 exemplarily shows the first look-up table associated with the switching circuit of FIGS. 1 and 2.

Referring to FIG. 3, as described above, the control unit 400 may refer to the first look-up table stored in the memory device 500 in order to determine the on-resistance of the switching circuit 50.

For example, if the temperature of the switching circuit 50 received from the temperature measuring unit 200 is "a", the control unit 400 may use the temperature "a" as an index to determine "x" associated with the temperature "a" in the first look-up table as the on-resistance of the switching circuit 50. As another example, if the temperature of the switching circuit 50 is "b", the control unit 400 may determine "y" associated with the temperature "b" in the first look-up table as the on-resistance of the switching circuit 50.

The apparatus 1 determines the second current value indicating the current flowing through the switching circuit 50 based on the temperature of the switching circuit 50 and the voltage at both ends of the switching circuit 50 by utilizing a characteristic in which an on-resistance of a semiconductor switch such as a FET included in the switching circuit 50 varies depending on temperature. Next, the apparatus 1 compares the second current value with the first current value measured using the shunt resistor 30, thereby improving the accuracy of the current measurement without adding a Hall effect sensor or the like.

Figure 4:
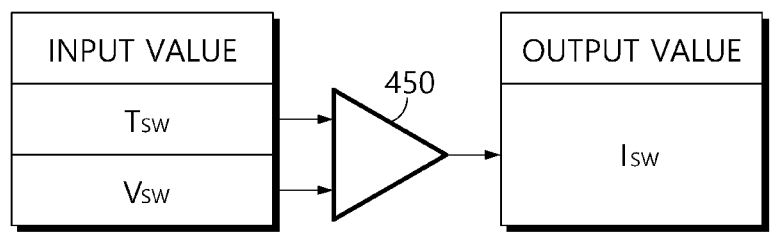
FIG. 4 exemplarily shows a logic circuit included in the control unit of FIGS. 1 and 2.

FIG. 4 exemplarily shows a logic circuit included in the control unit of FIGS. 1 and 2.

Referring to FIG. 4, the control unit 400 may determine the second current value using a logic circuit 450 included in the control unit 400. Here, the logic circuit 450 may be configured to output a second current value ($I_{SW}$) as an output value when a temperature ($T_{SW}$) of the switching circuit 50 and a voltage ($V_{SW}$) at both ends of the switching circuit 50 are received as input values.

The apparatus 1 may be applied to a battery management system (BMS). That is, the BMS may include the apparatus 1. At least some of the components of the apparatus 1 may be implemented by supplementing the functions of the components included in a conventional BMS or adding new functions. For example, the control unit 400 and the memory device 500 of the apparatus 1 may be implemented as components of the BMS.

Figure 5:
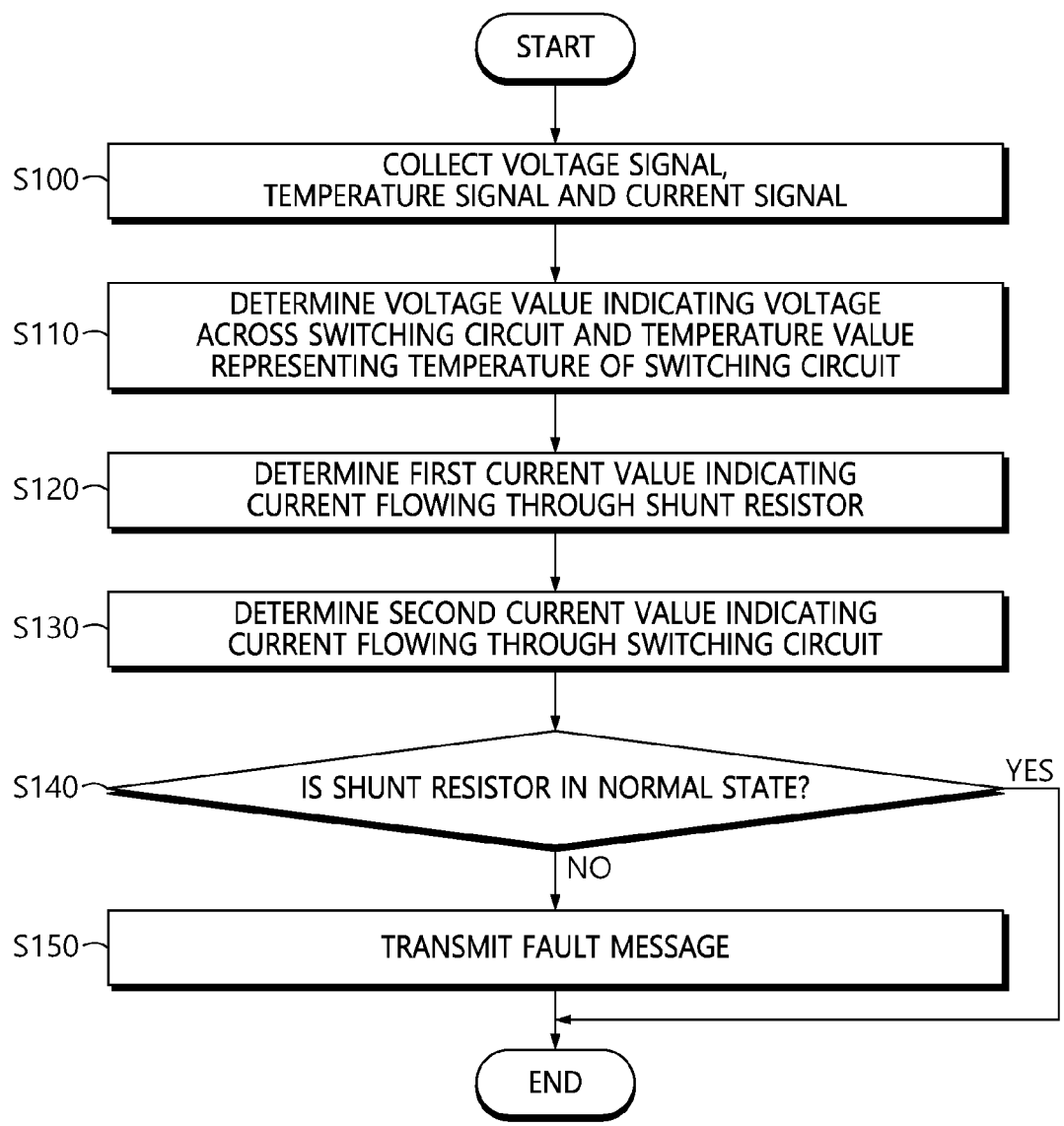
FIG. 5 is a flowchart schematically showing a current measuring method according to another embodiment of the present disclosure.

FIG. 5 is a flowchart schematically showing a current measuring method according to another embodiment of the present disclosure. A subject performing each step included in the method of FIG. 5 may be each component of the apparatus 1.

Referring to FIG. 5, in Step S100, the control unit 400 collects the voltage signal from the voltage measuring unit 100, the temperature signal from the temperature measuring unit 200, and the current signal from the current measuring unit 300.

In Step S110, the control unit 400 determines a voltage value indicating the voltage across the switching circuit 50 and a temperature value indicating the temperature of the switching circuit 50 based on the voltage signal and the temperature signal.

In Step S120, the control unit 400 determines the first current value indicating a current flowing through the shunt resistor 30 based on the current signal. Since the shunt resistor 30 is installed on the charging and discharging path, the first current value also represents a current flowing through the charging and discharging path.

In Step S130, the control unit 400 determines the second current value indicating a current flowing through the switching circuit 50 based on the voltage value and the temperature value determined in Step S110. Since the switching circuit 50 is installed on the charging and discharging path, the second current value also represents the current flowing through the charging and discharging path.

In Step S140, based on the first current value and the second current value, it is determined whether the shunt resistor 30 is in a normal state. For example, if the difference between the first current value and the second current value is within the normal range, it may be determined that the shunt resistor 30 is in the normal state. Meanwhile, if the difference between the first current value and the second current value is out of the normal range, it may be determined that the shunt resistor 30 is in a fault state. If the value of Step S140 is "NO", the process may proceed to Step S150. If the value of Step S140 is "YES", the method may end.

In Step S150, the control unit 400 may transmit a fault message to the external device 2. The fault message is to inform the user or the external device 2 that the shunt resistor 30 is in the fault state.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. A current measuring apparatus for measuring a current flowing through a charging and discharging path of a battery, the current measuring apparatus comprising:
    a switching circuit installed on the charging and discharging path;
    a current measuring unit including a shunt resistor installed on the charging and discharging path and configured to output a current signal corresponding to a voltage across the shunt resistor;
    a voltage measuring unit configured to measure a voltage across the switching circuit;
    a temperature measuring unit configured to measure a temperature of the switching circuit; and
    a control unit operably coupled to the switching circuit, the current measuring unit, the voltage measuring unit and the temperature measuring unit,
    wherein the control unit is configured to:
    determine a first current value indicating a current flowing through the shunt resistor, based on the current signal,
    determine a second current value indicating a current flowing through the switching circuit, based on the measured voltage and the measured temperature, and
    determine whether the shunt resistor is in a normal state, based on the first current value and the second current value.

2. The current measuring apparatus according to claim 1, wherein the control unit is configured to determine an on-resistance of the switching circuit, based on the measured temperature, and
    wherein the second current value is obtained by dividing the measured voltage by the on-resistance.

3. The current measuring apparatus according to claim 2, further comprising:
    a memory device configured to store a look-up table in which a correspondence between a temperature of the switching circuit and an on-resistance of the switching circuit is recorded,
    wherein the control unit is configured to determine an on-resistance, which is recorded in the look-up table as being associated with the measured temperature, as the on-resistance of the switching circuit, by using the measured temperature as an index.

4. The current measuring apparatus according to claim 1, wherein the control unit is configured to determine a third current value indicating the current flowing through the charging and discharging path, based on the first current value and the second current value.

5. The current measuring apparatus according to claim 4, wherein the control unit is configured to determine one of the first current value, the second current value and an average of the first current value and the second current value as the third current value, when a difference between the first current value and the second current value is within a normal range.

6. The current measuring apparatus according to claim 4, wherein the control unit is configured to determine the second current value as the third current value, when a difference between the first current value and the second current value is out of a normal range.

7. The current measuring apparatus according to claim 4, wherein the control unit is configured to output a fault message, when a difference between the first current value and the second current value is out of a normal range.

8. The current measuring apparatus according to claim 6, wherein the control unit is configured to determine the normal range, based on the measured temperature.

9. The current measuring apparatus according to claim 8, wherein the control unit is configured to enlarge the normal range as the measured temperature is lowered.

10. A battery pack, comprising the current measuring apparatus according to claim 1.

11. A current measuring method for measuring a current flowing through a charging and discharging path of a battery, the current measuring method comprising:
    measuring a voltage across a switching circuit that is installed on the charging and discharging path;
    measuring a temperature of the switching circuit;

determining a first current value indicating a current flowing through a shunt resistor that is installed on the charging and discharging path, based on a voltage across the shunt resistor;

determining a second current value indicating a current flowing through the switching circuit, based on the measured voltage and the measured temperature; and determining whether the shunt resistor is in a normal state, based on the first current value and the second current value.

12. The current measuring method according to claim 11, wherein the second current value is obtained by dividing the measured voltage by an on-resistance associated with the measured temperature.

13. The current measuring method according to claim 11, wherein in the step of determining whether the shunt resistor is in the normal state, it is determined that the shunt resistor is in the normal state when a difference between the first current value and the second current value is within a normal range.

* * * * *